United States Patent [19]

Addis et al.

[11] Patent Number: 4,704,558
[45] Date of Patent: Nov. 3, 1987

[54] METHOD AND APPARATUS FOR AUTOMATIC OSCILLOSCOPE CALIBRATION

[75] Inventors: John L. Addis, Beaverton; David W. Morgan, Gaston, both of Oreg.

[73] Assignee: Tektronix, Inc., Beaverton, Oreg.

[21] Appl. No.: 803,685

[22] Filed: Dec. 2, 1985

[51] Int. Cl.⁴ .............................................. H01J 31/26
[52] U.S. Cl. .................................... 315/10; 315/370; 313/462
[58] Field of Search .......................... 315/10, 370, 371; 313/462, 471; 358/67, 68, 69, 10; 328/188, 189; 324/404

[56] References Cited

U.S. PATENT DOCUMENTS

| | | | |
|---|---|---|---|
| 4,159,484 | 6/1979 | Strathman | 358/10 |
| 4,163,250 | 7/1979 | Tomii et al. | 358/67 |
| 4,283,655 | 8/1981 | Mossman et al. | 313/462 |
| 4,439,735 | 3/1984 | Alvite et al. | 324/404 |
| 4,514,756 | 4/1985 | Blank et al. | 358/67 |

Primary Examiner—Theodore M. Blum
Attorney, Agent, or Firm—Mark L. Becker

[57] ABSTRACT

A beam detection apparatus for sensing the position of an electron beam within a cathode ray tube is disclosed. The apparatus includes a photodetector for optically detecting the intersections of the electron beam with a graticule line on the faceplate of the cathode ray tube. In a second embodiment, an electrically conductive pattern of reference markers is applied to the graticule for intercepting the beam and a detector is coupled to the conductive pattern for detecting the interception. Calibration circuitry is also included to generate input signals to deflection amplifiers coupled to the cathode ray tube and to evaluate detection signals generated by the beam coinciding with a graticule line. The calibration circuitry compares the input signals to the input signal value represented by the graticule line and adjusts the deflection amplifiers of the cathode ray tube accordingly to cause the beam to coincide with a graticule line bearing a predetermined relationship to the input signal deflecting the beam.

4 Claims, 5 Drawing Figures ic # METHOD AND APPARATUS FOR AUTOMATIC OSCILLOSCOPE CALIBRATION

REFERENCE TO RELATED APPLICATION

This application is filed simultaneously with copending application Ser. No. 803,693, filed Dec. 2, 1985.

TECHNICAL FIELD

This invention relates to a method and apparatus for sensing the position of an electron beam in a cathode ray tube and, more particularly, to a method and apparatus for sensing the beam position and automatically calibrating the deflection of the beam to a graticule on the faceplate of the cathode ray tube.

BACKGROUND OF THE INVENTION

The deflection of the electron beam within a cathode ray tube of an oscilloscope must be periodically calibrated to the graticule on the faceplate to ensure that the graticule is accurately measuring the amplitude and duration of waveforms reproduced by the beam. Until the present invention, this calibration has largely been done manually at the factory. Typically, a calibration signal is applied as a deflection waveform input to the cathode ray tube to deflect the beam. An operator then visually determines the position of the beam relative to the graticule line and manually adjusts deflection amplifiers associated with the cathode ray tube to deflect the beam until it coincides with the graticule line.

This manual approach is expensive because it is slow and labor intensive. It is also relatively inaccurate. A single, manual calibration at the factory does not ensure calibration over the range of temperatures in which an oscilloscope operates. With programmable deflection amplifiers especially, the effect of temperature variations limits accuracy to 4%.

The present state of the art provides means whereby horizontal and vertical deflection parameters for the electron beam can be adjusted under software control. Calibration signal sources can be controlled by the same software. No capability, however, has been available to enable the software to properly set the deflection parameters relative to the graticule.

Several means have been developed to automatically detect the position of the electron beam relative to the faceplate of the cathode ray tube. For example, beam index display systems used in color televisions employ an indexing phosphor that emits ultraviolet light when struck by the electron beam as it is swept across the faceplate in a raster scan. This light is detected by a photodetector adjacent to the cathode ray tube, which generates a signal to synchronize the color video signals to the colored phosphors placed between indexing phosphors. Such systems are disclosed in U.S. Pat. No. 4,247,869 to Culter et al, U.S. Pat. No 2,790,107 to Bradley, U.S. Pat. No. 2,778,971 to Sunstein, and British Patent 822,017.

These systems, however, require the use of a special cathode ray tube having an indexing phosphor, and index to a phosphor inside the cathode ray tube, not a graticule line useful to an observer. Moreover, these systems do not provide a means for adjusting the deflection of the electron beam in response to the detection of its position.

Accordingly, a need remains for a method and apparatus for sensing beam position relative to the graticule and automatically calibrating the beam deflection parameters.

SUMMARY OF THE INVENTION

It is an object of the present invention to provide a method and apparatus for automatically calibrating the deflection of an electron beam within a cathode ray tube.

It is another object of the present invention to provide a means for automatically sensing the beam position relative to indicia on the faceplate of a cathode ray tube.

It is another object of the invention to electrically couple the electron beam to the graticule of the cathode ray tube.

To achieve these objects, the invention provides an apparatus for sensing the position of an electron beam within a cathode ray tube, which includes conductive means defining a pattern associated with the graticule for intercepting the electron beam and detecting means coupled to the conductive means for detecting the interception of the beam by the conductive means. The detecting means generates a detection signal in response to the interception.

In one aspect of the invention, the conductive means comprises an electrically conductive layer of tin oxide applied to the faceplate to couple electrically the electron beam to the detecting means. The conductive layer is applied in a predetermined pattern to the faceplate, such as over the graticule.

In another aspect of the invention, the conductive means comprises means for optically coupling into the faceplate the light generated by the electron beam striking the phosphor of the cathode ray tube in an area adjacent to the lines of the graticule. This means can be the graticule itself. The light conducted laterally within the faceplate is then detected by a photodetector mounted at the edge of the faceplate.

An automatic calibration apparatus is also disclosed that combines calibrating means with the sensing apparatus. The calibrating means is coupled to the detecting means and to amplifying means associated with the cathode ray tube. The calibrating means provides input signals to the amplifying means to deflect the electron beam to coincide with the graticule line. The calibrating means compares the detection signals generated by the detecting means to the corresponding input signals and then adjusts the amplifying means until the coincidence of the beam with the graticule bears a predetermined relationship to the input signal deflecting the beam.

The foregoing and other objects, features, and advantages of the invention will become more apparent from the following detailed description of a preferred embodiment which proceeds with reference to the accompanying drawings.

DETAILED DESCRIPTION

Figure 1:
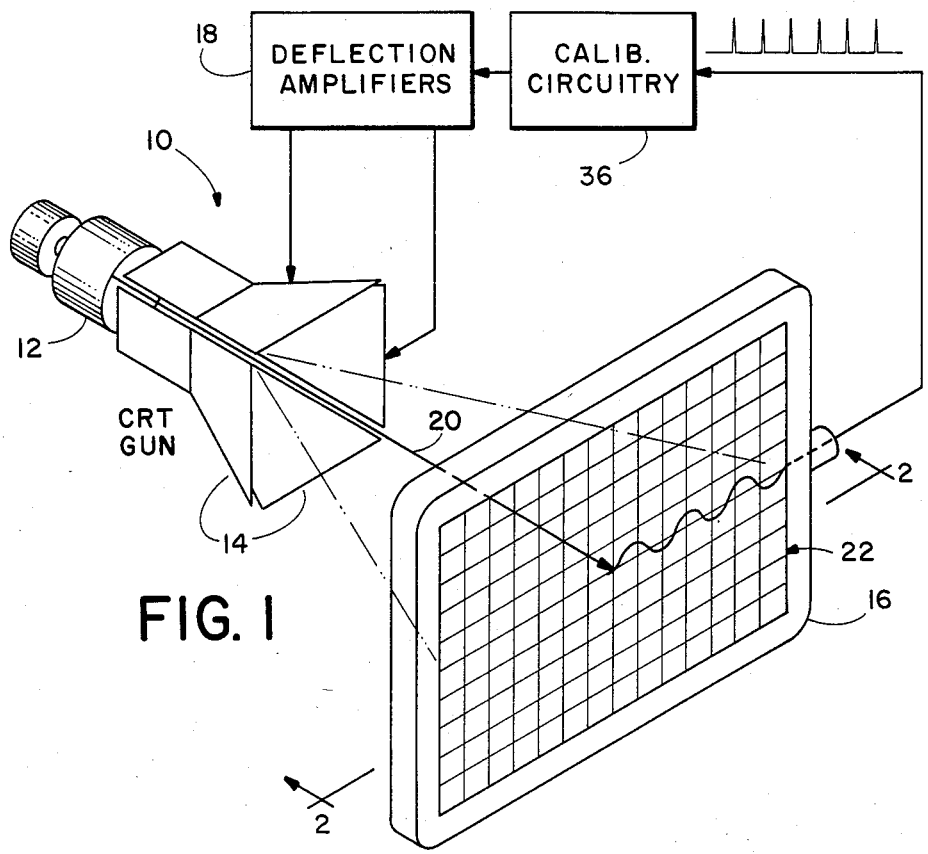
FIG. 1 is an exploded, pictorial view of a cathode ray tube illustrating the method and apparatus of the invention.

Referring to FIG. 1, an apparatus according to the invention includes a cathode ray tube 10 having an electron gun 12, deflection plates 14, and a faceplate 16. Signals generated by deflection amplifiers 18 are coupled to the deflection plates 14 to sweep an electron beam 20 horizontally and vertically across the faceplate 16. The movement of the beam 20 is typically in response to an input from an external waveform which the beam reproduces on the faceplate 16. In crossing the faceplate 16, the beam coincides with lines of a graticule 22 which measure the amplitude and duration of the reproduced waveform.

Figures 2, 4:
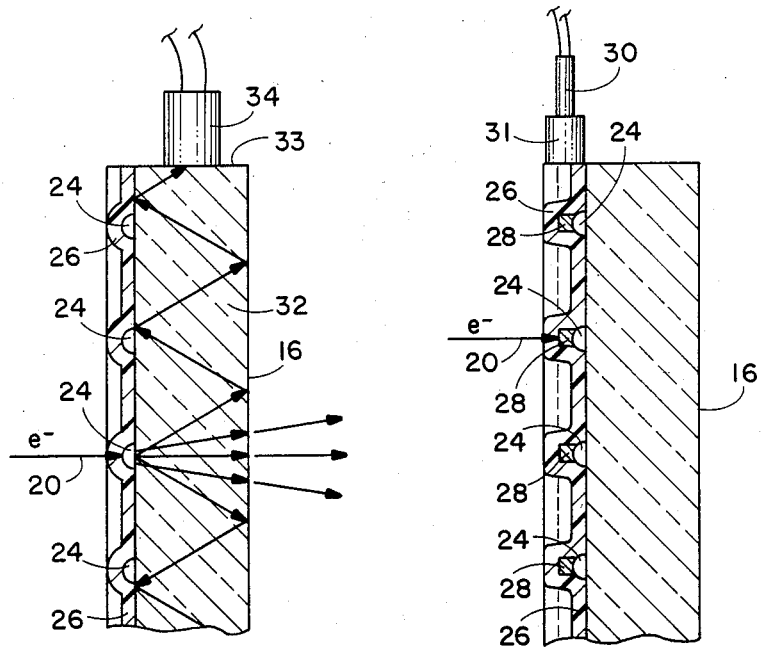
FIG. 2 is a cross-sectional view of the faceplate of a cathode ray tube taken along line 2—2 of FIG. 1.
FIG. 4 is a second cross-sectional view of a faceplate of a cathode ray tube showing a conductive pattern layered on the graticule.

Referring to FIG. 2, the graticule 22 is a scale defining a rectangular grid and boundary. The scale is provided on the inner surface of the faceplate 16 by raised glass lines 24 that are fused onto the faceplate. The lines 24 form a white translucent glass. A layer of phosphor material 26 forming a fluorescent screen is applied to the inner surface of the faceplate over the graticule 22. Fusing the glass lines 24 to the faceplate 16 in this manner substantially eliminates parallax between the beam's position on the phosphor and on the graticule 22. The graticule is suitably illuminated by edge lighting (not shown) at the edge of faceplate 16. The lighting can be energized, de-energized or varied as desired.

Figure 3:
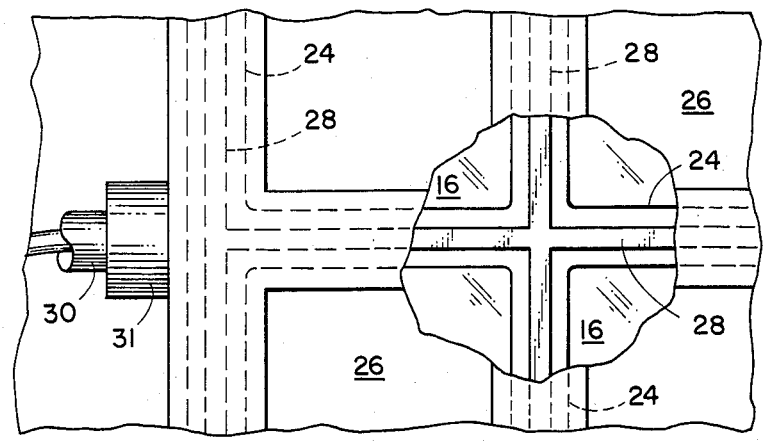
FIG. 3 is an enlarged back view of a faceplate of a cathode ray tube.

Referring to FIGS. 3 and 4, the faceplate 16 of the cathode ray tube includes conductive means in the form of an electrically conductive pattern of thin wires or strips 28 of tin oxide. The wires 28 are shown in FIGS. 3 and 4 affixed to the graticule lines 24, but they can also be affixed as reference markers in any other predetermined pattern on the faceplate. The wires 28 intercept the beam 20 and conduct an electrical signal that is detected by detecting means such as a capacitor 30 coupled to the edge of the pattern of wires 28. Optionally, to filter out electrical signals generated by noise, the electron beam may be modulated along the Z (intensity) axis of the cathode ray tube 10 at a predetermined frequency. The electrical signal that is conducted by wires 28 is then demodulated by a detector 31 and filtered by capacitor 30.

Figure 5:
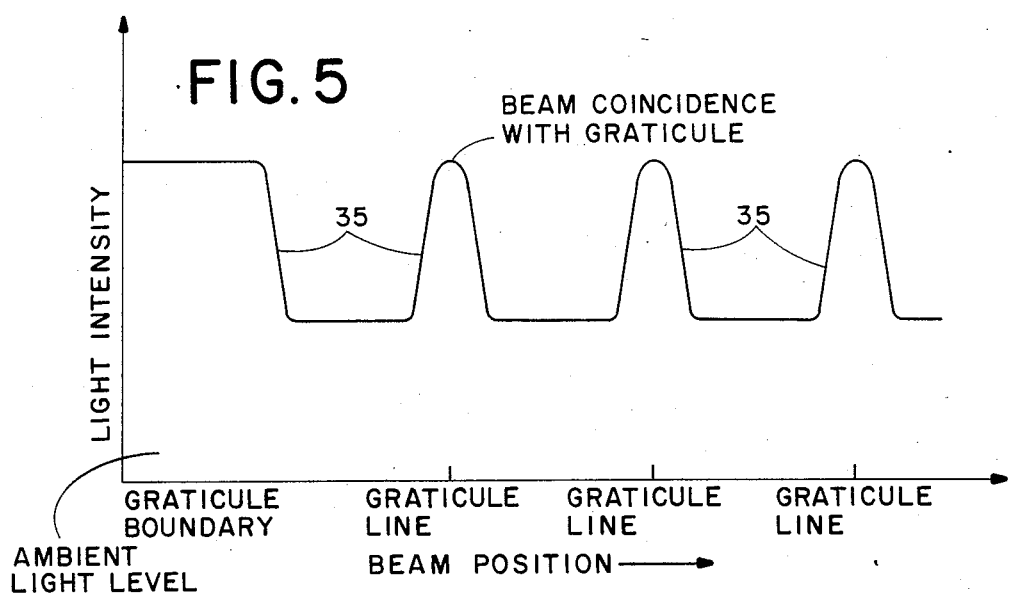
FIG. 5 is a graph of light intensity relative to beam position on the faceplate of the cathode ray tube.

The conductive means is not limited to an electrically conductive pattern of wires 28 but can include optically conductive means such as the graticule 22 for coupling light from the beam 20 into the faceplate 16. Referring to FIG. 2, when the beam 20 strikes the phosphor material 26 that overlies a graticule line 24, light generated by the phosphor material is coupled through the line into the faceplate 16. A portion of the light is internally reflected within the faceplate, as indicated by arrows 32, toward a lateral side 33 of the faceplate where it is detected by detecting means in the form of a photodetector 34. As shown in FIG. 5, the photodetector 34 detects the peaks 35 in light intensity generated by the beam striking phosphor material 26 overlying a graticule line 24. The photodetector 34 then generates in response an electrical detection signal that indicates coincidence of the beam with a graticule line.

Optically coupling the light from the phosphor material 26 into the faceplate 16 through the graticule 22 does not require the use of an additional pattern of wire 28 to detect the beam position. The optical coupling technique does, however, require filtering circuitry to be as reliable as the electrically conductive wire technique. As shown in FIG. 5, an ambient level of light intensity caused by electrical and optical noise such as the edge lighting interferes with accurate detection of the beam coincidence. Detection is improved by adding the filter circuitry (not shown) to the apparatus. Such filter circuitry is described in copending application Ser. No. 803,693, which is incorporated herein by reference.

Referring again to FIG. 1, this capability to detect the coincidence of the beam 20 with a graticule line 24 is employed through calibration circuitry 36 to calibrate the beam's deflection. The calibration circuitry 36 provides a series of predetermined input test signals to the deflection amplifiers 18 to sweep the electron beam 20 across a portion of the graticule 22. These signals have a predetermined relationship to the pattern of graticule lines 24 (or to another pattern if the electrically conductive wire technique is employed other than over the graticule lines). The calibration circuitry 36 compares each detection signal to the corresponding input signal to determine whether the beam coincided with a graticule line in response to the input test signal. It then adjusts the gain and offset of the deflection amplifiers 18 until the coincidence of the beam with the graticule line bears the predetermined relationship to the input signal that deflected the beam.

In the method of the invention, the calibration circuitry 36 generates a sequential series of predetermined input signals to deflect the electron beam in a unique search pattern across the graticule 22 of the faceplate 16. The pattern can be of many types, such as a sweep traversing the graticule or an oscillation of increasing magnitude originating at the center line of the graticule. When the beam coincides with a graticule line 24, the detecting means detects the coincidence and transmits the resulting detection signal to the calibration circuitry 36. The circuitry 36 then compares the value of the input test signal that deflected the beam onto a graticule line to the input signal value represented by the graticule line. If the value of the input signal exceeds the represented signal value, the gain of the deflection amplifiers 18 is adjusted downwardly. If the value of the input test signal is less than the represented signal value, the gain of the deflection amplifiers 18 is adjusted upwardly. A similar technique is used to adjust the offset of the amplifiers 18. The method is repeated until the the beam is caused to coincide with the graticule line 24 by a corrected input signal that represents the value of the graticule line.

A number of different circuits can be employed as the calibration circuitry 34, such as the circuit described in copending application Ser. No. 803,693. For example, a microprocessor and its associated peripheral circuitry can be coupled to the deflection amplifiers 18 and the detecting means. The microprocessor is conventionally programmed to carry out the calibration either at power-up of the oscilloscope or periodically during its use.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. An apparatus for sensing the position of an electron beam within a cathode ray tube, the cathode ray tube having a faceplate, comprising:

A graticule comprising lines mounted on the faceplate for optically coupling light generated by the electron beam into the faceplate when a line is intersected by the electron beam, a portion of the generated light being internally reflected within the faceplate; and photodetector means mounted adjacent to the faceplate for detecting from the electron beam only the portion of generated light internally reflected within the faceplate, the photodetector means indicating the intersection of the beam with a graticule line in response to a detectable increase in the reflected light.

2. An apparatus for calibrating the deflection of an electron beam in a cathode ray tube, the cathode ray tube having a faceplate, comprising:

amplifying means for deflecting the electron beam within the cathode ray tube;

a graticule on the faceplate for measuring deflection of the electron beam;

a pattern of electrically conductive reference markers applied to the graticule for intercepting the electron beam;

detecting means coupled to the pattern of markers for detecting the interception of the beam by one of the reference markers, the detecting means in response generating a detection signal; and calibrating means for calibrating the deflection of the electron beam, the calibrating means providing predetermined input test signals to the amplifying means to deflect the electron beam across the pattern of reference markers, the calibrating means responsive to the detecting means to adjust the deflection of the electron beam until the beam coincides with a reference marker bearing a predetermined relationship to the test input signal deflecting the beam.

3. The apparatus of claim 2 in which the conductive means comprises an electrically conductive pattern of metallic strips.

4. A method of calibrating deflection of an electron beam in a cathode ray tube including a faceplate, the cathode ray tube drive by amplifying means for deflecting an electron beam within the cathode ray tube, comprising the following steps:

providing a pattern of conductive reference markers on the faceplate;

generating predetermined input signals to the amplifying means to deflect the electron beam across a portion of the pattern;

electrically detecting the coincidence of the beam with one of the reference markers;

comparing the amplitude of the predetermined input signal coinciding with a reference marker with the amplitude represented by the reference marker; and adjusting the amplifying means in response to the comparison to cause the beam to coincide with the reference marker bearing a predetermined relationship to the input signal deflecting the beam.

* * * * *